United States Patent [19]

Kretz

[11] 4,237,406
[45] Dec. 2, 1980

[54] EQUIPMENT FOR USE IN MEASURING THE DISTANCE BETWEEN DIFFERENT POINTS DISPLAYED ON A FLUORESCENT SCREEN

[75] Inventor: Carl Kretz, Zipf, Austria

[73] Assignee: Kretztechnik Gesellschaft m.b.H., Zipf, Austria

[21] Appl. No.: 57,678

[22] Filed: Jul. 16, 1979

[30] Foreign Application Priority Data

Oct. 6, 1978 [AT] Austria ................................ 7195/78

[51] Int. Cl.³ ............................................ G01R 13/30
[52] U.S. Cl. ...................................... 315/377; 128/712; 128/660
[58] Field of Search ................. 315/377; 33/15 P, 1 P, 33/1 C, 149 J; 128/660, 661, 712; 328/189

[56] References Cited

U.S. PATENT DOCUMENTS 3,027,485  3/1962  Davis ..................................... 315/377

FOREIGN PATENT DOCUMENTS 2619723 11/1976 Fed. Rep. of Germany .

*Primary Examiner*—Theodore M. Blum
*Attorney, Agent, or Firm*—Kurt Kelman

[57] ABSTRACT

The equipment serves to control the tracing of a center mark and of an arc of a circle centered on said mark on a fluorescent screen. A first controller adapted to deliver a first deflecting voltage, which determines the x coordinate of said mark, is operable by a knob to effect coarse and fine adjustments of said first deflecting voltage. A second controller adapted to deliver a second deflecting voltage, which determines the y coordinate of said mark, is operable by said knob to effect coarse and fine adjustments of said second deflecting voltage. Change-over means are provided for conditioning said first and second controllers for said coarse and fine adjustments. A third controller serves to control the radius of said circle.

27 Claims, 8 Drawing Figures

FIG.1
FIG.2
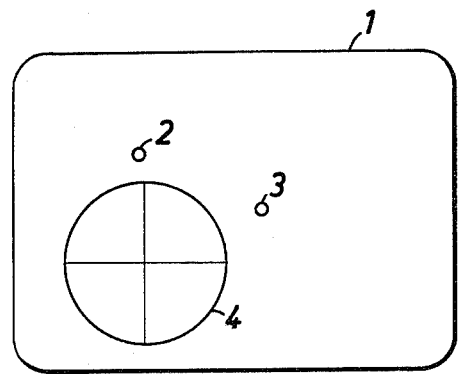
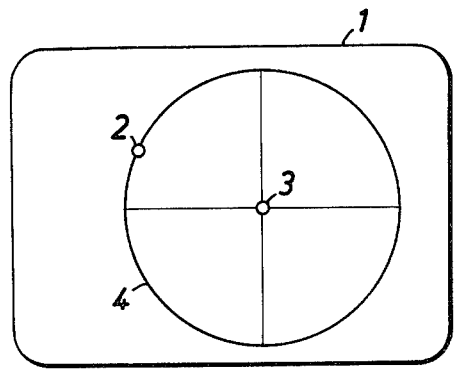
FIG.3
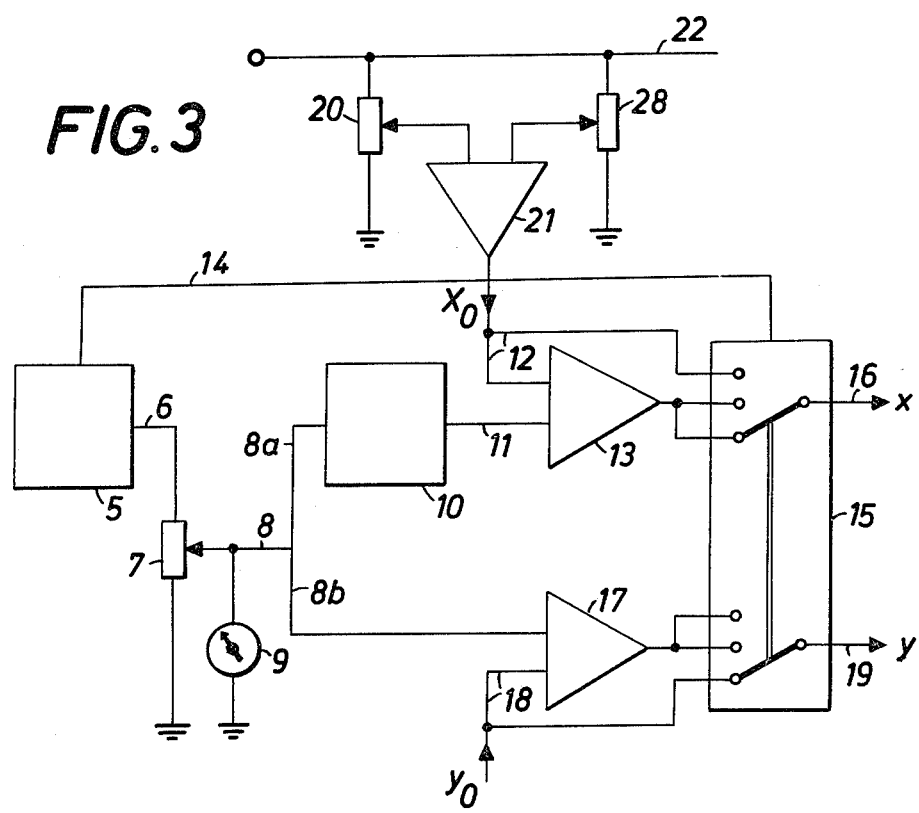

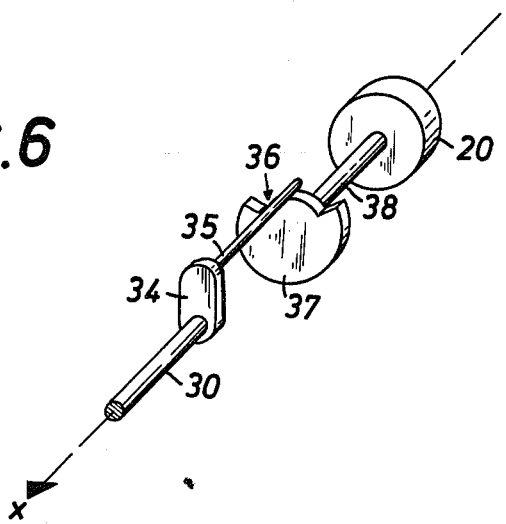
FIG.6
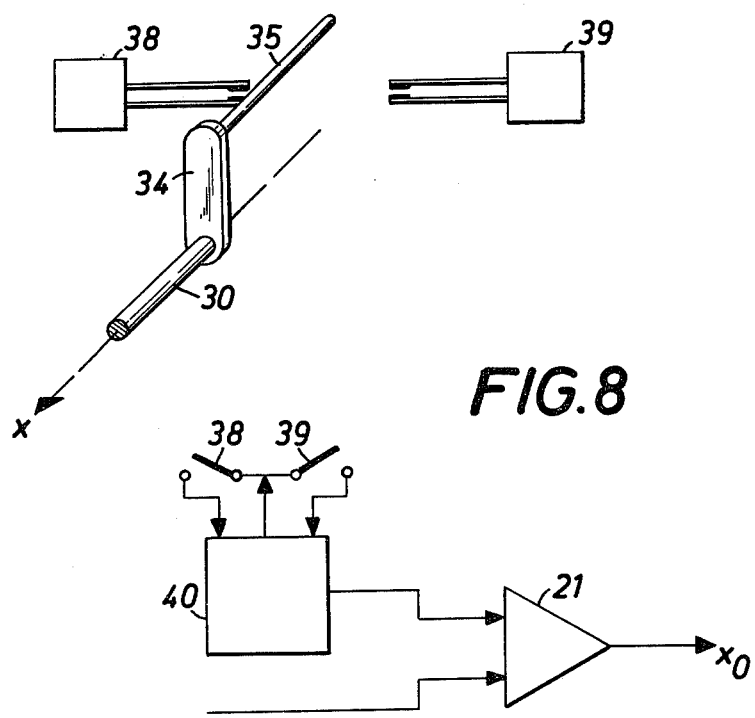
FIG.7
FIG.8

EQUIPMENT FOR USE IN MEASURING THE DISTANCE BETWEEN DIFFERENT POINTS DISPLAYED ON A FLUORESCENT SCREEN

This invention relates to another or improved equipment for use in carrying out the method of measuring the distance between different points displayed on a fluorescent screen, particularly on section surface displays generated as a result of ultrasonic examination, which method comprises tracing adjustable indicating marks, which consist of at least one circle or an arc of a circle and its center, on said screen. In that method, the center of the circle is adjusted to one of said points and the radius of the circle is then changed until the circle is coincident with or in close proximity to the other point, whereafter the radius of the circle as a measure of the distance between the points is ascertained from the adjustments which have been performed to adjust the radius of the circle and is directly indicated if desired. Such method is disclosed in U.S. Pat. No. 4,119,890. The equipment constitutes an accessory for a display unit having a fluorescent screen and is operable to supply the display unit with adjustable control voltages, which cause adjustable luminous marks to be traced on the fluorescent screen. Respective control voltages are used for the horizontal and vertical adjustments of the center mark and for the adjustment of the radius of the circle. A single-knob control unit is provided for the adjustment of said control voltages and has a knob, which is connected by a shaft to a voltage controller for adjusting the radius of the circle. Said shaft is carried by a gimbal mount, which has two shafts that extend at right angles to each other and are connected to respective rotary controllers, which control the horizontal and vertical adjustments of the center mark and are adjustable by a pivotal movement of the shaft.

The method disclosed in the above-mentioned patent is based on the recognition that the distance between two points having different x and y coordinates can be directly ascertained in the manner described. Besides, the deflecting voltages which are required can be modified that they are proportional to the actual distances in the horizontal and vertical directions so that different scales may be chosen for said two directions and the "circle" can be displayed by an "ellipse", which represents the points having a constant distance from a common point. In most cases it is sufficient to state merely the distance between two points so that only the controller which determines that distance must be a precision controller by which the controlled parameter can be exactly controlled to define the distance.

The overall adjustment is greatly facilitated by the use of a single-knob control unit, such as is used in the equipment which serves to carry out the method and is described in the above-mentioned patent. Such control unit can be operated like a control stick with one hand to perform the required sequence of measuring operations and may be constantly grasped during that sequence and be used even to follow movable or moving targets. This is required mainly in medical examinations.

In practice, the use of the control unit described in the above-mentioned patent for measuring operations has involved difficulties, particularly where relatively large fluorescent screens are employed. Suitable trimming operations must be performed, which permit of an exact, precise adjustment, on the one hand, and which permit of displacing the center mark and the circle throughout a large area of the fluorescent screen and, if possible throughout the area of the fluorescent screen. The controller, e.g., a potentiometer, which is operated directly by the shaft that is connected to the knob may by a multiturn controller so that the entire range which is interesting can be covered by a plurality of rotations of the control shaft. Whereas such arrangement permits of a fine adjustment throughout a sufficiently large range, the operation of the controller may take a relatively long time. Greater difficulties are involved in the adjustment of the center of the circle, such as a crossline center mark, by pivotal movements of the shaft. For design reasons, the pivotal movement is limited to about ±30° from the center position so that the total angular range of 60° is available for the adjustment. If a fluorescent screen having a side length of about 180 mm is used and there is a fixed relation between the pivotal movement of the shaft and the displacement of the center mark on the fluorescent screen, a pivotal movement of 1° corresponding to a displacement of 3 mm, it will be very difficult to move the mark which constitutes the center of the circle into coincidence with a desired point because a permissible deviation of 0.5 mm would mean that the shaft must be adjusted with an accuracy of about 0.2°. This is impossible or extremely difficult in practice. On the other hand, if the circuitry is designed so that a pivotal movement of the shaft through 1° corresponds to a displacement of the center mark by 0.5 mm, then the center mark can be displaced only to an extent of 30 mm along each of the x and y axes so that measurements can be taken only in a small region of the section display.

It is an object of the invention to provide equipment which is of the type described and permits a fast and exact adjustment at least of the center mark (center of circle) and preferably also of the circle itself.

This object is accomplished in that at least the two voltage controllers for the voltages for the horizontal and vertical adjustments consist each of control elements for coarse and fine adjustment, respectively, and are adapted to be changed over from one mode of adjustment to the other by means of range limit switches, stops, friction clutches or mechanical or electrical change-over switches during the operation of said voltage controllers.

It is another object of the invention to provide such equipment in which the change from one mode of adjustment to the other is automatically effected. To that end, stops may be provided which when the control stick is moved from the neutral position beyond a predetermined position effect an automatic change to coarse adjustment so that the center mark will then be coarsely adjusted in the direction of adjustment.

Alternatively, an arbitrary change over may be effected. To that end, the control stick may be provided with a push-button, which is operable to effect a change over from one mode of adjustment to the other.

In one embodiment, different control elements are provided for the coarse and fine adjustments and preferably consist of a stepping control element for the coarse adjustment and an infinite control element for the coarse and fine adjustments, respectively, are connected by an analog adder to a common control output if each of the two control elements is actually used to vary electric parameters. In the present specification, reference is made to control voltages although the controllers may be used also to change other electric parameters which influence the final positions of the center mark and of the circle or the circle display on the fluorescent screen. In one practical embodiment, potentiometers are used, the control element for the fine adjustment is fixedly coupled to the associated shaft of the gimbal mount, and the adjustable member of said control element or the associated shaft is provided with one-way coupling elements or limit switches which are disposed at the ends of its control range and serve to actuate the control element for the coarse adjustment. In another embodiment, the control element for the coarse adjustment comprises a voltage generator, which generates an output voltage that is variable by means of a counter, which is arranged to increase its count in response to the closing of one limit switch and to decrease its count in response to the closing of another limit switch so that the output voltage increases or decreases in dependence on the time for which the switches are closed. Besides, a mode selector switch may be provided for the voltage controllers and may be mounted, e.g., on the control knob. Such mode selector switch may tend to assume a position corresponding to one mode of adjustment so that there is initially always a coarse adjustment and a change over to a fine adjustment is subsequently effected. A third setting may be provided, in which the mode selector switch causes the controllers to be fixed in their last adjusted position so that the positions of the center mark and circle are fixed.

In another embodiment, a control voltage is generated by a voltage generator, which is controlled in dependence of the count of a two-way counter, the inputs of which are adapted to be activated by switches, which are operable by the control knob or the shafts of the gimbal mount in dependence on the direction of movement, and the mode selector switch precedes said switches and is adapted to be set to a plurality of positions associated with different clock rates or to one clock rate and a single-pulse mode. This means in practice that when the mode selector switch is set for a high clock rate the voltage will be changed quickly in the set counting sense so that the center mark or the arc of a circle quickly approaches the desired point of the object. A change over is then effected to a lower clock rate or to the single-pulse mode, in which only one counting step is performed in response to each operation of a sense-dependent switch. One counting step may be proportional to the spacing of two adjacent dots or lines on a television screen. That arrangement can be used for a virtually exact adjustment. Besides, the counter may be connected to indicating means permanently or by means of a read-out control and said indicating means may be arranged for an indication, e.g., a digital indication, of the coordinates of the center mark or of the desired radius of the circle. It will be desirable to adjust before each measurement the center mark to an initial location, to count only in accordance with the adjustments from that initial location, and to change the radius of the circle only when the center mark has been adjusted. The radius of the circle is then changed from a predetermined value, which may be zero.

The subject matter according to the invention is illustrated by way of example on the accompanying drawing, in which FIGS. 1 and 2 are diagrammatic views showing the display on a fluorescent screen before and after the adjustment, FIG. 3 is a block circuit diagram showing equipment according to the invention, FIG. 4 shows a control unit for use in the equipment according to the invention, and FIG. 5 is a diagram to which reference will be made in an explanation of the operations by which a change from coarse to fine adjustment is effected. In that diagram, the angular movement "a" about the axis "x" has been plotted in relation to the desired displacement "x".

FIGS. 6 and 7 show details of two embodiments of means for effecting a change over from coarse to fine adjustment and vice versa in a control unit as shown in FIG. 4.

FIG. 8 is a block circuit diagram showing an embodiment of the control unit.

Figure 4:
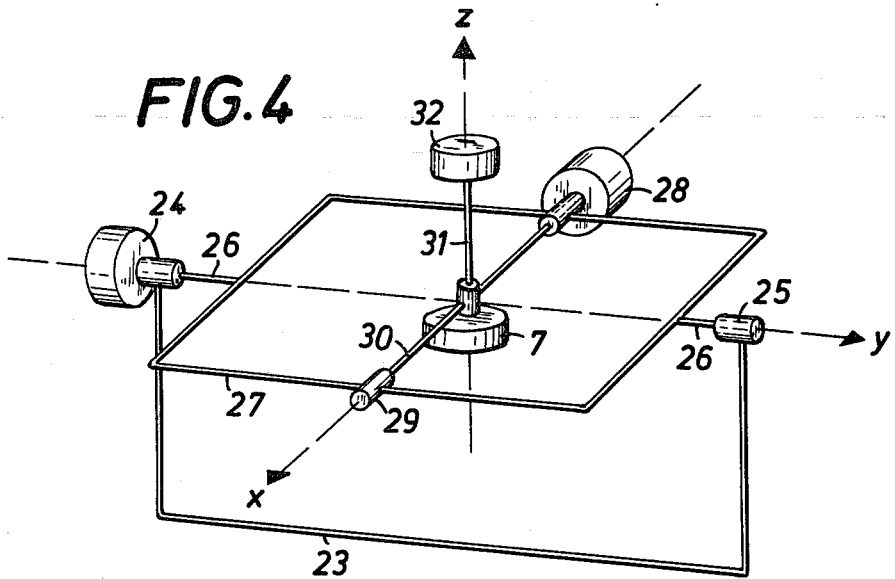

FIGS. 1 and 2 show a fluorescent screen 1, on which two points 2 and 3 are indicated, which may be interesting points of a section display generated in response to ultrasonic examination. The distance between said points is to be ascertained. When a master switch has been actuated, a circle 4 is traced on the fluorescent screen 1. In the embodiment shown by way of example the center of said circle is indicated by coordinate axes but said center may also be indicated by a single dot or another mark. For a measurement, setting control members are operated to move the center of the circle to a position in which it coincides with one of the points to be measured, e.g., the point 3. Another control member is then operated to change the radius of the circle 4 until the arc of a circle passes through the other point, which in the embodiment shown by way of example is the point 2. This is shown in FIG. 2. If the diameter of the circle is changed in steps, it will be changed until the circle is nearest to the point 2.

The equipment represented by the block circuit diagram in FIG. 3 may constitute an accessory for a display unit, which comprises a fluorescent screen. In that equipment, the voltage generated by a sine wave generator 5 is applied via a lead 6 to a potentiometer 7, from which a voltage is tapped under control of a control member and is applied via a lead 8. The peak value of that tapped voltage can be measured by a voltmeter 9, which may be omitted if the output voltage of the generator 5 is constant or if the setting of the potentiometer 7 or another adjustable control element is an exact measure of the output voltage applied to the lead 8. In any case, the setting of the controller connected to the lead 8 will always be an exact measure of the radius of the circle and in case of a proper adjustment of said radius will be an exact measure of the distance between the two points 2 and 3. The lead 8 to which the tapped sine wave voltage is applied is branched into two branch leads 8a, 8b. Branch lead 8a is connected to a quadrature phase shifter 10, which applies a cosine wave voltage via a lead 11 to an analog adder 13, in which a controlled d.c. voltage $x_o$ applied via a lead 12 is added to the cosine wave voltage. The second branch lead 8b is directly connected to an analog adder 17, in which a controlled d.c. voltage $y_o$ applied via a lead 18 is added to the sine wave voltage. The voltages $x_o$ and $y_o$ which determine the center of the circle are adjustable independently of each other by control elements which will be described hereinafter. The radius of the circle may be adjusted by the control element 7, as has been mentioned. In order to trace the coordinate axes which are shown, the outputs of the analog adders 13 and 17 are applied to an electric change-over switch 15, which is connected to the sine wave generator by a lead 14 and is triggered by the sine wave generator 5 to assume the next state. Via leads 12 and 18, the voltages $x_o$ and $y_o$ are directly applied to the change-over switch, which applies control voltages x and y via its output leads 16 and 19 to the corresponding deflecting plates associated with the fluorescent screen. When the change-over switch 15 is in the state corresponding to its uppermost position shown on the drawing, the voltage $x_o$ as well as a voltage corresponding to the sum of the sine wave voltage and $y_o$ will appear at the respective output leads so that a straight line having the elevation $x_o$ and a length corresponding to the adjusted sine wave voltage will be traced on the fluorescent screen. This corresponds to to the horizontal one of the coordinate axes. When the switch is in the state corresponding to its intermediate position on the drawing, a voltage corresponding to the sum of $x_o$ and the adjusted sine wave voltage and a voltage corresponding to the sum of $y_o$ and the adjusted sine wave voltage will be applied to the output leads 16 and 19, respectively, so that the circle 4 is traced. When the switch is in the state corresponding to its lowermost position, the vertical one of the axis of coordinates will be traced. The voltages delivered to leads 16 and 19 are applied to another electronic change-over switch, by which the display unit is connected in alternation to the measuring equipment and to a unit for generating the image in which the measurement is to be taken. Such means are known per se.

In the equipment shown, all adjustments required for the measurement may be performed with a single control knob. This is diagrammatically indicated in FIG. 4. A U-shaped member 23 is firmly connected to the main frame of the control unit. One limb of the U-shaped member carries a potentiometer 24, which serves also as a bearing. The other limb carries a bearing 25. Two stub shafts 26 extending in a y direction are mounted in respective ones of said bearings and carry a frame 27 or are secured to it. A second potentiometer 28 and a bearing 29, which is opposite to the potentiometer 28, are secured to the frame 27. A shaft 30 extends in the x direction through the components 28, 29.

A third potentiometer 7 corresponding to the component 7 in FIG. 3 is secured to the shaft 30 between the components 28 and 29 and has a shaft 31, which in position of rest extends in the z direction and is connected to a control knob 32. A movement of the control knob 32 in the yz plane will rotate the shaft 30 so that the setting of the potentiometer 28 will be changed. A pivotal movement of the knob 32 and shaft 31 in the xz plane will impart a rotation to the frame 27 so as to change the setting of the potentiometer 24. A rotation of the knob 32 and the shaft 31 on their own axis will change the setting of the potentiometer 7. Voltages $x_o$ and $y_o$ for shifting the center of the measuring circle are tapped from the potentiometers 24 and 28. The potentiometer 7 controls the voltage which determines the radius of the circle. The knob 32 may be caused to perform two or three movements at the same time.

The control unit shown in FIGS. 3 and 4 may be modified in that different control elements 7, 24 and 28 may be used to adjust the radius of the circle and the coordinates of the center of the circle.

The control unit described thus far is similar to the one which has been disclosed in the above-mentioned patent. A given rotation or pivotal movement of the shaft 31 corresponds to a proportional change of the associated control voltage.

In accordance with the object of the invention, a fast or coarse adjustment and a slow or fine adjustment at least of the coordinates x, y and preferably also of the radius should be made possible. Whereas in the control unit according to the above-mentioned patent there is a linear relationship between rotation or pivotal movement and the displacement, these linear relationships are eliminated and the range of adjustment of each parameter is divided into a plurality of sub-ranges. Whereas there is a linear relationship in each of said sub-ranges associated with a given parameter, the proportionality constants in the sub-ranges associated with a given parameter differ. The relationships and means for the adjustment in the x direction will be described in detail hereinafter. The relationships and means for the adjustment in the y direction and, if the controller for effecting the adjustment of the radius is correspondingly designed, the relationship and means for the adjustment of the radius are similar to those described and for this reason will not be discussed in detail.

Figure 5:
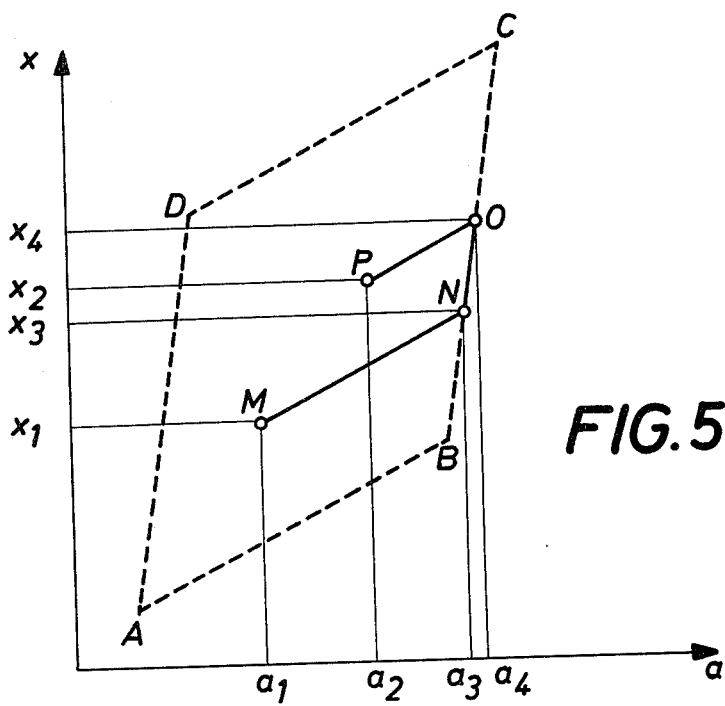

The relationship between a pivotal movement of the shaft 31 and the change of the x coordinate is diagrammatically indicated in FIG. 5. in which the pivotal movement a of the shaft 31 is plotted, which causes the center of the circle to be displaced in the x direction. The rhombic area ABCD shown on the drawing indicates the range which is available for the adjustment. The x coordinates of points A and C correspond to the edges of the fluorescent screen spaced apart in the x direction and the a coordinates of the points A and C indicate the limits of the pivotal movement. The following relationship exists between the x coordinate of the center of the circle and the pivotal movement a:

When the point having the coordinates x and a lies within the field ABCD, a change of the angle a will displace said point along a straight line that is parallel to AB and DC. During that movement a relatively large pivotal movement will result only in a small displacement of the center of the circle in the x direction because the change is effected in the range for fine adjustment. When the pivotal movement is continued until the point has reached the straight line AB or CD in the diagram, and the pivotal movement is then continued in the same sense, the point will move along one of these straight lines. A small pivotal movement will now result in a large displacement because the change is effected in the range of coarse adjustment. When the sense of the pivotal movement is reversed, the point will move towards AB or CD in a fine adjustment. The sequence of movements has been illustrated by way of example on the drawing. The center mark (center of the circle) is to be displaced from position $x_1$ to position $x_2$. When the center of the circle is in its initial position $x_1$, the control stick is in the angular position $a_1$. These two coordinates intersect at M. When the control stick is now pivotally moved in the direction a, the point will move to the right toward N on the straight line shown and a relatively large pivotal movement will result only in a small displacement because the adjustment is effected in the fine range. As soon as the pivotal movement has proceeded to $a_3$ on the straight line BC, the range of fine adjustment is left. As the associated coordinate $x_3$ is still smaller than the desired value $x_2$, the pivotal movement of the control stick 31 is continued and now effects a coarse adjustment until point O is reached. During that adjustment the relatively small change of the angle from $a_3$ to $a_4$ results in a relatively large displacement from $x_3$ to $x_4$. By experience, that adjustment proceeds beyond the desired coordinate $x_2$ so that the direction of movement must then be reversed. As this results in a departure from the straight line BC, that adjustment is effected in the fine range. The point moves from O to P to the desired position. In the manner which has been described, an adjustment from any desired position can be effected within the area ABCD and it makes no difference whether the angle is initially increased or decreased. The adjustment will always be effected in the fine mode first and only when the desired position cannot be reached by a fine adjustment will a change to a coarse adjustment be effected and the desired position will finally be reached by a fine adjustment. The change over to a fine adjustment will be automatically effected in response to a change of the direction of movement.

With reference to FIGS. 6 to 8, means will be described which permit of adhering to the relationships described with reference to FIG. 5.

In the embodiment shown in FIG. 6, potentiometer 20 is mounted on the shaft 30 in addition to the potentiometer 28. Regarding the shunt and/or leakage current that potentiometer is so desigend that the same pivotal movement results in a much larger voltage change and a much larger displacement of the target mark in the x direction than with the potentiometer 28 is rigidly coupled to the shaft 30, which has a lost motion relative to the shaft 33 for actuating the potentiometer 30. That lost motion can be exactly predetermined. In the embodiment shown by way of example, this is accomplished in that the shaft 30 terminates in a crank 34, which has a crankpin 35 that extends into a sector-shaped recess 36 of a coupling disc 37, which is connected to the shaft 33. As a result, the shaft 30 can be rotated in opposite directions through an angle that is defined by the recess 36 and the potentiometer 20 will not be adjusted if the shaft 30 is rotated in opposite directions through the angle which is defined by the recess 36. As is shown in FIG. 3, the two potentiometers 20 and 28 are connected to a supply lead 22. Because the proportionality constant might be changed if the potentiometers 20 and 28 were connected in series, their taps are connected to the input of an amplifying analog adder 21, which applies the output voltage $x_o$ to the leads 12. A similar arrangement is provided to generate the voltage $y_o$ and may also be provided instead of the simple potentiometer 7 to control the voltage which determines the radius of the circle. A fine adjustment will be effected as long as only the potentiometer 28 is adjusted whereas the potentiometer 20 is not adjusted and a constant voltage appears at its tap. Only when the potentiometer 20 is adjusted too will a coarse adjustment be effected but will this be changed to a fine adjustment whenever there is a standstill and reversal of motion.

In the embodiment shown in FIG. 7, a potentiometer 28 may again be provided for a fine adjustment. Instead of the potentiometer 20 shown in FIG. 6, two switches 38, 39 are provided, which will be actuated by the crank 35 at the respective ends of the pivotal movement thereof.

The two switches 38, 39 are associated with a voltage generator 40 (FIG. 8), which produces an output voltage that gradually increases when the switch 38 has been closed whereas the output voltage decreases when the switch 39 has been closed and remains constant when both switches 38 and 39 are open. In a simple arrangement, the voltage generator 40 is controlled in dependence on the count of a two-way counter, which is arranged to count up and down in response to the actuation of the switches 38 and 39, respectively. Like the output of the potentiometer, the output of the voltage generator 40 is connected to an amplifying analog adder 21, which has another input connected to the tap of the potentiometer 28, and which generates the output voltage $x_o$. If the generator 40 is controlled by a counter, the voltage will be changed in steps. Other control arrangements which may be used may result in an infinite change of the output voltage in response to the closing of either of switches 38 and 39. In that case, the relation-ships represented in FIG. 5 will be changed inasmuch as lines AD and BC will be vertical and the displacement from N to O will no longer be effected by a continued movement of the control stick but the latter is held in its final position, in which it closes the switch 38. The rise of the output voltage of the generator 40 will then result in the coarse adjustment from N to O.

The embodiment shown in FIG. 8 may be modified, particularly when the voltage generator 40 is controlled by a counter. In that modification the potentiometer 28 may be omitted and the two switches 38, 39 may be connected to a change-over switch, which is adapted to be connected in alternation to clocks having different clock rates to a clock and a single-pulse generator switch. In that case, when one of the switches 38 and 39 is closed and the change-over switch is in one position, the counter will count at the clock rate which results in a fast change of the output voltage of the generator 40. When the change-over switch is in the other position, the counter will count pulses at a lower rate or only individual pulses whenever one of the switches 38 and 39 has been operated and the output voltage of the generator 40 will then be changed only slowly. The amplifying analog adder 21 can be omitted in that case. If a corresponding arrangement is used to adjust the radius, a reading circuit may cause the count to be indicated directly by an indicator, e.g., a digital indicator, by which the radius is then directly indicated. The x and y coordinates may also be indicated in the manner described.

What is claimed is:

1. Equipment for controlling the tracing of a center mark and of an arc of a circle centered on said mark on a fluorescent screen, comprising
    a control knob,
    a first controller adapted to deliver a first deflecting voltage, which determines the x coordinate of said mark, and operable by said knob to effect coarse and fine adjustments of said first deflecting voltage,
    a second controller adapted to deliver a second deflecting voltage, which determines the y coordinate of said mark, and operable by said knob to effect coarse and fine adjustments of said second deflecting voltage,
    change-over means for conditioning said first and second controllers for said coarse and fine adjustments, and
    a third controller controlling the radius of said circle.

2. Equipment as set forth in claim 1, in which said third controller is operable by said knob to change said radius.

3. Equipment as set forth in claim 2, in which
    a gimbal mount comprises first and second shafts having axes intersecting at right angles to each other,
    said first shaft is rotatable to operate said first controller, said second shaft is rotatable to operate said second controller, said knob is connected to said third controller by a third shaft, which is rotatable to vary the radius of said circle and which is connected to said gimbal mount for pivotal movement about the axes of both said first and second shafts, and each of said first and second shafts is arranged to rotate about its axis in unison with a pivotal movement of said third shaft.

4. Equipment as set forth in claim 3, in which
each of said first and second controllers comprises a control element for coarse adjustment and a control element for fine adjustment, each control element for fine adjustment is non-rotatably coupled to the respective shaft of said gimbal mount, and said change-over means comprise limiting means which are non-rotatably connected to said first and second shafts and define a range for the adjustment of the control element for fine adjustment and are arranged to enable the associated control element for coarse adjustment when said control element for fine adjustment has been adjusted to an end of said range.

5. Equipment as set forth in claim 4, in which said limiting means comprise one-way coupling elements for coupling said control element for coarse adjustment to said shaft.

6. Equipment as set forth in claim 4, in which said limiting means comprise limit switches.

7. Equipment as set forth in claim 1, in which said change-over means comprise limit switches.

8. Equipment as set forth in claim 1, in which said change-over means comprise stop means.

9. Equipment as set forth in claim 1, in which said change-over means comprise friction clutches.

10. Equipment as set forth in claim 1, in which said change-over means comprise mechanically operated change-over switches.

11. Equipment as set forth in claim 1, in which said change-over means comprise electrically operable change-over switches.

12. Equipment as set forth in claim 1, in which each of said first and second controllers comprises a control element for coarse adjustment and a control element for fine adjustment.

13. Equipment as set forth in claim 12, in which each of said first and second controllers comprises a stepping control element for coarse adjustment and an infinitely adjustable control element for fine adjustment.

14. Equipment as set forth in claim 13, in which each of said first and second controllers comprises a potentiometer for fine adjustment.

15. Equipment as set forth in claim 13, in which each of said first and second controllers comprises a common output element to which said control elements for coarse and fine adjustment are connected.

16. Equipment as set forth in claim 15, in which said common output element comprises an analog adder having two inputs, to which said control elements for coarse and fine adjustment are respectively connected.

17. Equipment as set forth in claim 1, in which
a clock is provided,
each of said first and second controllers comprises a two-way counter adapted to change its count in response to pulses from said clock, and a voltage generator for generating an output voltage depending on the count of said counter, and said change-over means comprise means for causing said counter to alternatively increase and decrease its count in response to said pulses.

18. Equipment as set forth in claim 17, in which
said change-over means comprise two pairs of limit switches defining respective ranges for the adjustment of said control elements for fine adjustment of said first and second controllers and said counter is arranged to increase its count for a coarse adjustment of said output voltage as long as one limit switch of the associated pair is closed and to decrease its count for a coarse adjustment of said output voltage as long as the other limit switch of the associated pair is closed.

19. Equipment as et forth in claim 17, in which
said change-over means comprise a mode selector switch, which is movable between two positions for coarse and fine adjustment, respectively, and said counter is arranged to change its count in response to pulses from said clock as long as said mode selector switch is in position for coarse adjustment.

20. Equipment as set forth in claim 17, in which
a second pulse generator is provided, said change-over means comprise two pairs of enabling switches adapted to be selectively closed by means of said knob and associated with said first and second controllers, respectively, and a mode selector switch, which is movable between two positions for coarse and fine adjustment, respectively, said counter is arranged to change its count in response to pulses from said clock when said mode selector switch is in position for coarse adjustment, and in response to pulses from said second pulse generator when said mode selector switch is in position for fine adjustment, and said counter is arranged to increase its count as long as one enabling switch of the associated pair is closed and to decrease its count as long as the other enabling switch of the associated pair is closed.

21. Equipment as set forth in claim 20, in which said second pulse generator is a second clock operable at a lower pulse rate than the first-mentioned clock.

22. Equipment as set forth in claim 20, in which said second pulse generator is arranged to deliver a single pulse in response to the closing of one of said switches.

23. Equipment as set forth in claim 1, in which said change-over means comprise a mode selector switch, which is movable between two positions for conditioning said first and second controllers for coarse and fine adjustment, respectively.

24. Equipment as set forth in claim 23, in which said mode selector switch is carried by said knob.

25. Equipment as set forth in claim 1, in which
a clock and a second pulse generator are provided,
said change-over means comprise a pair of spaced apart enabling switches associated with said third controller, and a mode selector switch, which is movable between two positions for coarse and fine adjustment, respectively, said third controller comprises a counter arranged to change its count in response to pulses from said clock when said mode selector switch is in position for coarse adjustment, and in response to pulses from said second pulse generator when said mode selector switch is in position for fine adjustment, and a voltage generator for generating an output voltage which depends on the count of said counter and controls the radius of said circle, said counter is arranged to increase its count as long as one switch of said pair is closed and to decrease its count as long as the other switch of said pair is closed, and indicating means are provided which are adapted to indicate the count of said counter.

26. Equipment as set forth in claim 25, in which said indicating means are arranged to permanently indicate the count of said counter.

27. Equipment as set forth in claim 25, in which a read-out switch is operable to enable said indicating means to indicate the count of said counter.

* * * * *